US006752634B2

(12) United States Patent
Gonzalez et al.

(10) Patent No.: US 6,752,634 B2
(45) Date of Patent: Jun. 22, 2004

(54) CONTACT ARRAY FOR SEMICONDUCTOR PACKAGE

(75) Inventors: Carlos A. Gonzalez, Chandler, AZ (US); Biju Chandran, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/957,536

(22) Filed: Sep. 21, 2001

(65) Prior Publication Data

US 2003/0060061 A1 Mar. 27, 2003

(51) Int. Cl.[7] .............................................. H01R 12/00
(52) U.S. Cl. ........................................... 439/66; 439/91
(58) Field of Search ........................... 439/66, 591, 74, 439/68, 69, 91

(56) References Cited

U.S. PATENT DOCUMENTS

| | | | | |
|---|---|---|---|---|
| 4,402,562 A | * | 9/1983 | Sado | 439/66 |
| 5,046,953 A | * | 9/1991 | Shreeve et al. | 174/260 |
| 5,801,441 A | * | 9/1998 | DiStefano et al. | 257/688 |
| 6,052,286 A | * | 4/2000 | Worthen et al. | 257/703 |
| 6,176,708 B1 | * | 1/2001 | Michiya | 439/66 |
| 6,193,523 B1 | * | 2/2001 | Harper, Jr. | 439/66 |
| 6,220,869 B1 | * | 4/2001 | Grant et al. | 439/66 |
| 6,224,396 B1 | * | 5/2001 | Chan et al. | 439/66 |
| 6,435,883 B1 | * | 8/2002 | Warren | 439/71 |

* cited by examiner

Primary Examiner—P. Austin Bradley
Assistant Examiner—Edwin A. Leon
(74) Attorney, Agent, or Firm—Schwegman, Lundberg, Woessner & Kluth, P.A.

(57) ABSTRACT

An array of contacts for electrically connecting a semiconductor package to a circuit board. The contacts are carried by a tape having an adhesive border. The tape, along with the contacts, are applied easily to either the substrate or the circuit board using the adhesive border. Each contact is made of two S-shaped pieces in perpendicular directions. The contacts are inserted into holes in the tape and held there by friction.

26 Claims, 2 Drawing Sheets

CONTACT ARRAY FOR SEMICONDUCTOR PACKAGE

FIELD

This invention relates to a contact array for connecting a semiconductor package to a circuit board. More particularly, this invention relates to a low-profile array of contacts carried by a tape for connecting a semiconductor package to a circuit board.

BACKGROUND

Since semiconductor chips are very small, it is preferable to first mount the chip in a package using a ball grid array or similar arrangement and then to mount the package on the circuit board. Electrical connections must be made between the chip and the substrate in the package and also between the substrate and the circuit board. A popular method of making the connection between the substrate and board is the use of pin connectors.

While these pin connectors generally have been reliable, there are certain problems which have not yet been overcome. The first problem is the cost to manufacture the pins and the sockets into which they fit. Presently, the bodies used to hold the contacts are molded out of liquid crystal polymer material. This requires specialized skills and equipment to design and mold the parts. Controlling the tolerances on liquid crystal polymer molding is a major limit for scaling these connectors to smaller pitches and lower profiles.

The ability to have lower profiles is especially important in this environment. When the substrate and the circuit board are close together, the connectors between the two are short. This leads to not only a lower resistivity, but also a lower inductance. It also leads to a smaller size for the circuit board, which is always important in integrated circuitry. Prior art low-profile contacts have been on the order of 3 ½ mm. A reduction in this size, along with a lower resistivity, lower inductance and the resultant improvement in signal clarity and speed would be a desirable feature.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 1:
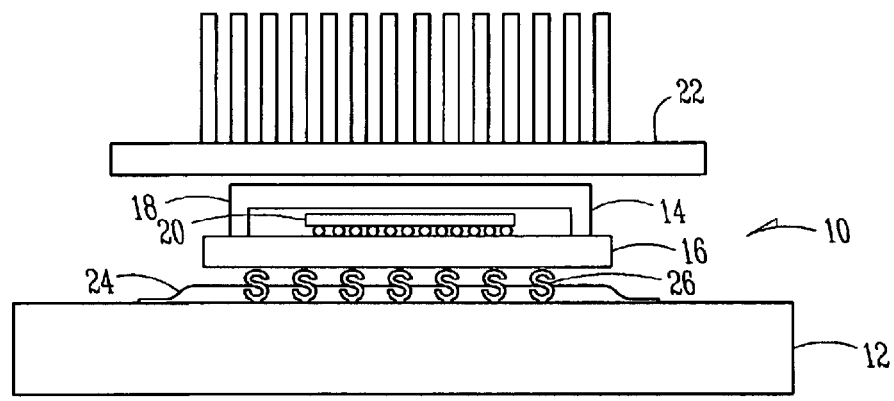
FIG. 1 is a side view of an example advantageous embodiment showing the features the present invention.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same.

Referring now to FIG. 1, an arrangement 10 of a semiconductor package on a circuit board is shown. The package 14 includes a substrate 16, a chip 20 mounted on the substrate using a ball grid array or similar arrangement, and a heat spreader 18. A heat sink 22 is placed over the heat spreader. The heat spreader and heat sink act to carry heat away from the semiconductor chip.

The package with the heat sink on top is mounted on circuit board 12 using an array of contacts 26. The contacts are carried by a thin flexible material 24 such as a polymer film or tape. The tape and contacts form a unit which is assembled in advance to simplify the mounting of the package to the circuit board. The ends of the tape are attached to the circuit board using an adhesive to hold the assembly in place. By placing this array on the circuit board first, the package may then be lowered into position onto the contacts in a simple fashion to form the completed assembly. The contacts 26 then form the electrical connection between the circuit board and the package. It is often not even necessary to solder the contacts to either the board or the package.

Figure 2:
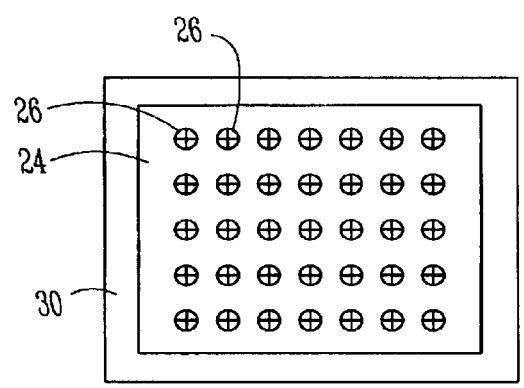
FIG. 2 is a top view of the advantageous embodiment shown in FIG. 1.

As seen in FIG. 2, the contacts 26 form a two-dimensional array on the tape 24. This array matches the pattern of the contacts on both the circuit board and the bottom of the package. The border of tape 30 has an adhesive applied thereto for holding the tape and contact assembly in place on the circuit board. The adhesive could also be formed over the entire tape, but is only necessary in areas likely to contact the board. It would also be possible to use other types of fastenings to hold the tape in place, but a simple adhesive is preferred.

Figure 3:
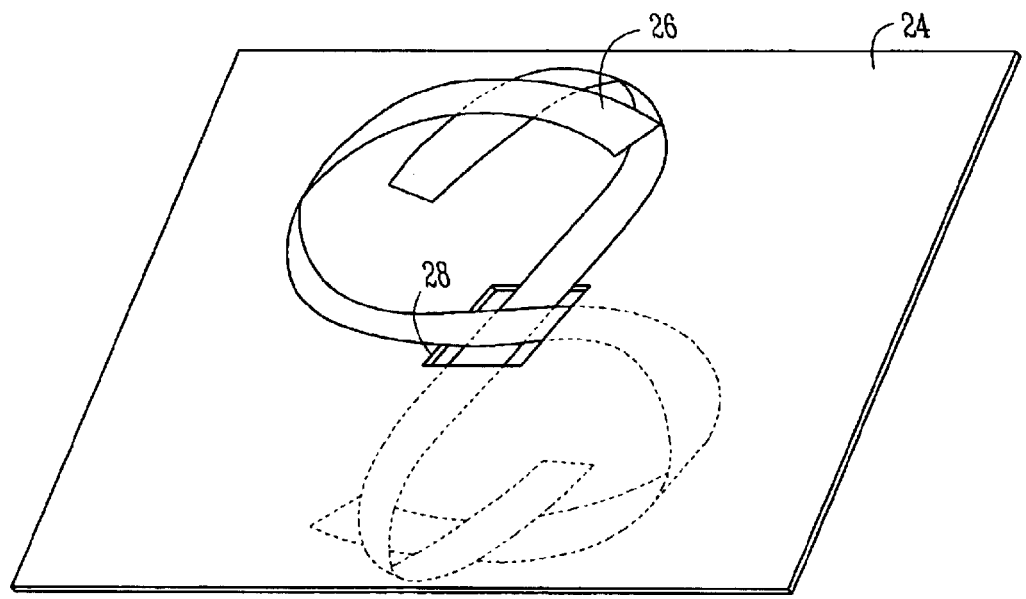
FIG. 3 is a view of an individual contact in the advantageous embodiment shown in FIG. 1.

As seen in FIG. 3, each individual contact is formed of two S-shaped metal pieces which are perpendicular to each other and also to the tape. The two S's are in contact at the top, middle and bottom. Preferably, the S's are formed from a symmetrical cross shape cut or stamped from a sheet of metal. The vertical arms are bent to form one S, and the horizontal arms are bent to form the other S. Where the two S's cross near the top and bottom, preferably they are free to slide over each other as they are compressed. It would also be possible for the S's to be attached at these points using adhesive, soldering or other joining methods. It would also be possible for the two S's to be formed from separate pieces and joined at the central crossover point by the same methods.

The contact is inserted through a hole 28 in the tape 24. The hole may be of a relatively small size if the tape is stretchy enough to allow the contact to be inserted. It may also be possible to heat the film to make it more flexible or to otherwise process the film to allow insertion of the contacts and to close up the opening afterwards. Alternatively, the lower half of each S may be left straight until after the contact is inserted through the tape and then bent into the proper shape. The contacts are arranged in the tape before being applied to the circuit board so that the assembly step is quick and simple.

The contact should be made of an electrically conductive material which has sufficient spring to support the weight of the package and heat sink. A preferred material is BeCu alloy. Other conductive materials, such as copper alloys are also possible as long as they have sufficient strength and spring for this function. Softer materials such as pure copper are not preferred because they are too soft. The use of two S shaped pieces provide strength to the contact in two different directions. The shape of the pieces helps to provide the necessary springiness. Contacts of this general shape have been utilized previously in land grid array connectors, but not carried by a tape. If desired, the top, or bottom, or both of the contact may be soldered to the adjoining structure. However, if the adhesive border of the tape is sufficiently strong, it is not necessary to solder the contact since the tape will hold the contact in proper alignment without other attachments. The top and bottom may also be flattened slightly to provide better contact.

Because of the strength and spring of these contacts, it is possible to reduce the space between the substrate and circuit board to about ½ mm. This is a substantial reduction from the pin contact arrangements of the prior art. The result is a lower resistivity and inductance as well as a smaller package. Less noise is generated as a result and higher speeds are possible.

The contact of FIG. 3 shows the S pieces as being of a thin material. However these pieces could be substantially thicker such as shown in profile in FIG. 1. It would also be possible to make the contacts from a single cast piece so that the contact points are integrally formed intersections rather than overlapping joints.

Figure 4:
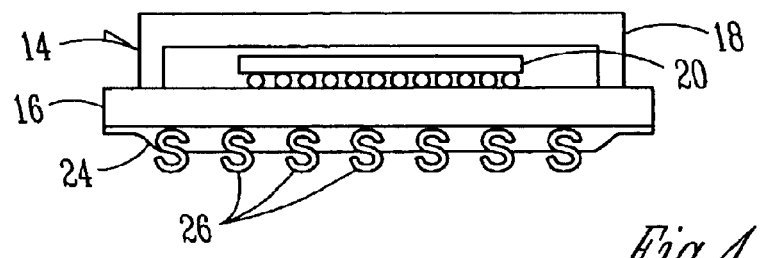
FIG. 4 is a side view of a second example advantageous embodiment showing the features the present invention.

If desired, it would be possible to apply the tape and contacts to the package side rather than the circuit board side of the connection. This is seen in FIG. 4 where the tape 24 and contacts 26 are held the bottom of substrate 16 of the package 14. This provides the same effect but in some cases may have an advantage in the manufacturing process.

Figure 5:
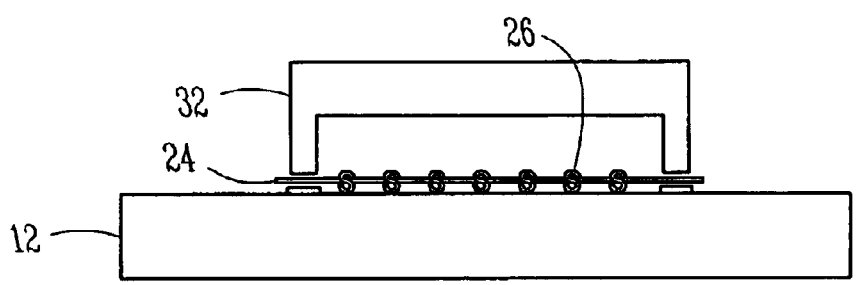
FIG. 5 is a side view of the manufacturing step to form the advantageous embodiment shown in FIG. 1.

FIG. 5 shows the arrangement for applying the tape 24 to the circuit board. A tool 32 has depending sections which are shaped like the border 30 of the tape. The tool is merely moved downwardly against the border to cause the adhesive to stick to circuit board 12. It also may be possible to use a similarly shaped tool to apply the tape to the substrate 16. If the adhesive used is heat sensitive rather than pressure sensitive, the tool may have heated depending sections to activate the adhesive.

Figure 6:
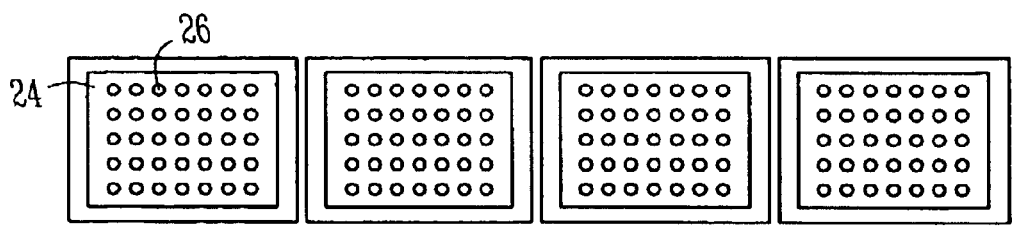
FIG. 6 is a top view of an array of contacts used for manufacturing according to either of the advantageous embodiments.

FIG. 6 shows an arrangement of several arrays of contacts formed as a single strip in order to automate the manufacturing process. Thus, a roll of tape in this fashion can be unwound as it is applied to the circuit board or substrate by tool 32. In pressing the tape to the board, it is also possible to have a sharp edge on the tool to separate that array from the remaining strip. A separate knife could also be used for the same purpose.

In concluding, reference in the specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A device for connecting a semiconductor package to a circuit board, comprising:
   a tape having an array of holes formed therein;
   a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board, wherein for each of the contacts, each first S-shaped section and each second S-shaped section are arranged substantially perpendicular to each other and substantially perpendicular to a main surface of said tape such that each first end portion is on one side of said main surface and each second end portion is on another side of said main surface; and
   a fastening device for attaching said tape to one of said semiconductor package and said circuit board.

2. The device according to claim 1, wherein the fastening device is an adhesive border on said tape.

3. The device according to claim 1, wherein the array of holes substantially matches a pattern of contacts on said circuit board and semiconductor package.

4. The device according to claim 1, wherein the two sections are biased to be in contact with each other at least three locations.

5. The device according to claim 1, wherein the device is fastened to the circuit board.

6. The device according to claim 1, wherein the device is fastened to the semiconductor package.

7. A device for connecting a semiconductor package to a circuit board, comprising:
   a tape having an array of holes formed therein;

a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board; and a fastening device for attaching said tape to one of said semiconductor package and said circuit board, wherein said contacts are made of a copper alloy, and wherein the alloy is BeCu.

8. A device for connecting a semiconductor package to a circuit board, comprising:

a tape having an array of holes formed therein;

a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board, wherein approximately half of each S-shaped section is on each side of the tape; and a fastening device for attaching said tape to one of said semiconductor package and said circuit board.

9. A method for mounting a semiconductor package on a circuit board, comprising:

inserting a plurality of contacts into an array of holes in a tape, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board;

placing the tape on one of the semiconductor package and the circuit board;

contacting part of said tape with a tool to fasten the tape in position; and placing the other of said semiconductor package and the circuit board onto said tape, wherein placing the other of said semiconductor package and circuit board onto said tape includes sliding the first end of one first S-shaped section over the first end of one second S-shaped section when the S-shaped section and the second S-shaped section are compressed.

10. The method according to claim 9, further comprising pressing by said tool to adhere the tape by an adhesive border.

11. The method according to claim 9, wherein, the array of holes substantially matches a pattern of contacts on said circuit board and said semiconductor package.

12. The method according to claim 9, wherein said inserting said contacts include positioning two S-shaped sections substantially perpendicular to each other.

13. An assembly of a circuit board and a semiconductor package, comprising:

a circuit board having an array of contacts;

a semiconductor package having an array of contacts;

a tape having an array of holes and contacts carried in said holes, said contacts matching at least ones of said array of contacts of said semiconductor package and said circuit board, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board;

an adhesive border on said tape holding said tape in position on one of said circuit board and said semiconductor package;

wherein said contacts carried by said tape forming electrical connection between said circuit board and said semiconductor package, and wherein approximately half of each S-shaped section is on each side of the tape.

14. The device according to claim 13, wherein for each of the contacts, each first S-shaped section and each second S-shaped section are arranged substantially perpendicular to each other and substantially perpendicular to a main surface of said tape such that each first end portion is on one side of said main surface and each second end portion is on another side of said main surface.

15. The device according to claim 13, wherein the plurality of sections are in contact with each other at three locations.

16. The device according to claim 13, wherein said contacts are made of a copper alloy.

17. The device according to claim 16, wherein the alloy is BeCu.

18. A device for connecting a first set of array contacts to a second set of array contacts, comprising:

a tape having an array of holes formed therein; and a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the first end portion of a corresponding second S-shaped portion and each second end portion is substantially adjacent the second end section of the corresponding second S-shaped section, wherein for each contact, each first S-shaped section and each second S-shaped section are arranged substantially perpendicular to each other and substantially perpendicular to a main surface of said tape such that each first end portion is on one side of said main surface and each second end portion is on another side of said main surface.

19. The device according to claim 18, wherein the tape has an adhesive border on said tape for fastening thereof to at least one of the first set of array contacts and the second set of array contacts.

20. The device according to claim 18, wherein the array of holes substantially matches a pattern of contacts on said first set of array contacts and said second set of array contacts.

21. A device for connecting a first set of array contacts to a second set of array contacts, comprising:

a tape having an array of holes formed therein: and a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the first end portion of a corresponding second S-shaped portion and each second end portion is substantially adjacent the second end section of the corresponding second S-shaped section wherein approximately half of each S-shaped section is on each side of the tape.

22. An electronic system comprising:

a first component having a first set of array contacts;

a second component having a second set of array contacts;

a tape having an array of holes formed therein; and a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the first end portion of a corresponding second S-shaped section and each second end portion is substantially adjacent the second end portion of the corresponding second S-shaped section, wherein for each contact, each first S-shaped section and each second S-shaped section are arranged substantially perpendicular to each other and substantially perpendicular to a main surface of said tape such that each first end portion is on one side of said main surface and each second end portion is on another side of said main surface, and wherein the plurality of contacts provide electrical connection between ones of the first set of array contacts and the second set of array contacts.

23. The electronic system according to claim 22, wherein the tape has an adhesive border on said tape for fastening thereof to at least one of the first set of array contacts and the second set of array contacts.

24. The device according to claim 22, wherein the array of holes substantially matches a pattern of contacts on said first set of array contacts and said second set of array contacts.

25. An electronic system comprising:

a first component having a first set of array contacts;

a second component having a second set of array contacts;

a tape having an array of holes formed therein; and a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the first end portion of a corresponding second S-shaped section and each second end portion is substantially adjacent the second end portion of the corresponding second S-shaped section, wherein approximately half of each S-shaped section is on each side of the tape, and wherein the plurality of contacts provide electrical connection between ones of the first set of array contacts and the second set of array contacts.

26. A device for connecting a semiconductor package to a circuit board, comprising:

a tape having an array of holes formed therein, a plurality of contacts, each contact including at least a first S-shaped section passing through a corresponding hole on the tape and a second S-shaped section passing through the corresponding hole on the tape, the first S-shaped section having a first end portion and a second end portion, the second S-shaped section having a first end portion and a second end portion, each first S-shaped section passing through the corresponding hole such that each first end portion is substantially adjacent the semiconductor package and each second end portion is substantially adjacent the circuit board, each second S-shaped section passing through the corresponding hole such that each first end portion is substantially adjacent the semiconductor package and each second end portion is substantially adjacent the circuit board, wherein the first end of one first S-shaped section slides over the first end of one second S-shaped section when the first S-shaped section and the second S-shaped section are compressed; and a fastening device for attaching said tape to one of said semiconductor package and said circuit board.

* * * * *

UNITED STATES PATENT AND TRADEMARK OFFICE
CERTIFICATE OF CORRECTION

PATENT NO. : 6,752,634 B2  
DATED : June 22, 2004  
INVENTOR(S) : Gonzalez et al.

Page 1 of 1

It is certified that error appears in the above-identified patent and that said Letters Patent is hereby corrected as shown below:

Column 6,  
Line 9, delete "wherein," and insert -- further comprising matching --.  
Line 10, delete "matches" and insert -- with --.

Column 7,  
Line 26, delete ":" and insert -- ; --.

Column 8,  
Line 40, delete "," and insert -- ; --.

Signed and Sealed this

Twenty-first Day of March, 2006

JON W. DUDAS  
*Director of the United States Patent and Trademark Office*